United States Patent [19]

Nii

[11] Patent Number: 5,473,172
[45] Date of Patent: Dec. 5, 1995

[54] HETERO JUNCTION BIPOLAR TRANSISTOR

[75] Inventor: Keita Nii, Kyoto, Japan

[73] Assignee: Rohm Co., Ltd., Kyoto, Japan

[21] Appl. No.: 320,419

[22] Filed: Oct. 5, 1994

Related U.S. Application Data

[63] Continuation of Ser. No. 876,185, Apr. 30, 1992, abandoned.

[30] Foreign Application Priority Data

Jul. 22, 1991 [JP] Japan ................... 3-180911

[51] Int. Cl.⁶ .................. H01L 29/06; H01L 29/00; H01L 29/78
[52] U.S. Cl. .................. 257/183; 257/183.1; 257/187; 257/197
[58] Field of Search .................. 257/197, 198, 257/77, 517, 183, 183.1, 200, 196, 187

[56] References Cited

U.S. PATENT DOCUMENTS

| | | | |
|---|---|---|---|
| 4,698,127 | 10/1987 | Hideshima et al. | 257/517 |
| 4,885,614 | 12/1989 | Furakawa et al. | 257/183 |
| 4,903,104 | 2/1990 | Kawai et al. | 257/198 |
| 5,144,398 | 9/1992 | Morishita | 257/77 |

FOREIGN PATENT DOCUMENTS 59-203799  11/1984  Japan .

Primary Examiner—Sara W. Crane
Assistant Examiner—Carl Whitehead, Jr.
Attorney, Agent, or Firm—Brumbaugh, Graves, Donohue & Raymond

[57] ABSTRACT

A hetero junction bipolar transistor which is high both in operating speed and in gain. The hetero junction bipolar transistor has a base layer consisting of Si (silicon) grown laterally by epitaxial growth, which isolates a collector region and an external base region from each other.

1 Claim, 2 Drawing Sheets

HETERO JUNCTION BIPOLAR TRANSISTOR

This application is a continuation of application Ser. No. 07/876,185, filed on Apr. 30, 1992 now abandoned.

BACKGROUND OF THE INVENTION

This invention relates to a hetero junction bipolar transistor which is operatable at high speed, and a method of manufacturing the same.

DESCRIPTION OF THE PRIOR ART

In general, in a hetero junction bipolar transistor (hereinafter referred to merely as "an HBT", when applicable), the injection of carriers from the base into the emitter can be prevented by making the forbidden band width of the emitter region larger than that of the base region, and the base resistance can be decreased by increasing the doping density of the base. Hence, the HBT is advantageous in that it can be increased both in amplification factor and in operating speed. Thus, development of the HBT has been advanced recently.

An example of the conventional HBT is shown in FIG. 2. The reference numeral 104 denotes an $n^+$ type substrate; 105, an n type substrate; 106, a $p^+$ type base region; 107, a hetero emitter region; 108, an emitter electrode; 109, base electrodes; and 110, a collector electrode. When the HBT is operated, a voltage applied to a intrinsic base junction is lower than a voltage applied to an external base junction. Therefore, when a voltage $V_{CE}$ applied between the collector and the emitter is made large in order to flow large current, then a leakage current from the external base junction is increased so that the base current is increased. As a result, a current amplification factor $h_{FE}$ is deteriorated.

Further, the conventional HBT is disadvantageous in that, when, in order to operate the HBT at high speed, the element is reduced in dimension, current flows from the collector region into the external base region of high density, thus lowering the gain.

SUMMARY OF THE INVENTION

Accordingly, an object of this invention is to eliminate the above-describe difficulty accompanying a conventional hetero junction bipolar transistor. More specifically, an object of the invention is to provide a hetero junction bipolar transistor which is high both in operating speed and in gain.

In order to achieve the foregoing object, in a hetero junction bipolar transistor of the invention, an Si (silicon) layer is grown laterally by epitaxial growth, to form a base region, which isolates a collector region and an external base region from each other, thereby inhibiting the flow of current from the collector region to the external base region. That is, the collector region is isolated from the external base region by a high melting point insulating material layer, so that no current flows from the corrector region to the external base region. Thus, the transistor is high in gain. In addition, the base resistance can be decreased, and the transistor can operate at higher speed.

The hetero junction bipolar transistor is manufactured according to a method of the invention, comprises: a step of patterning a high melting point insulating material layer on an Si substrate; a step of growing an Si layer laterally by vapor growth deposition; and a step of growing a semiconductor layer on the Si layer thus grown, which is larger in band gap than the Si layer.

In the hetero junction bipolar transistor thus designed, the collector is isolated from the external base by the high melting point insulating material layer, and therefore no current flows from the collector region to the external base region. Therefore, the HBT is high in gain. Furthermore, the base current can be decreased, and therefore the HBT can operate at higher speed.

BRIEF DESCRIPTION OF THE DRAWING

The parts (a) through (g) of FIG. 1 are explanatory diagrams showing steps of manufacturing a hetero junction bipolar transistor according to this invention.

PREFERRED EMBODIMENT OF THE INVENTION

Figure 1A:
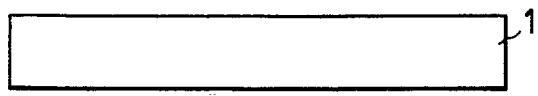
Figure 1B:
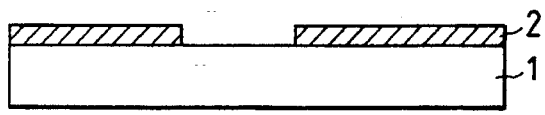
Figure 1C:
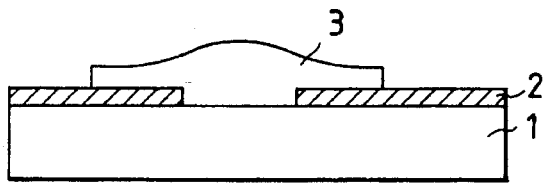
Figure 1D:
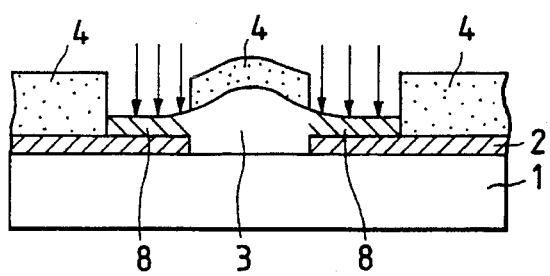
Figure 1E:
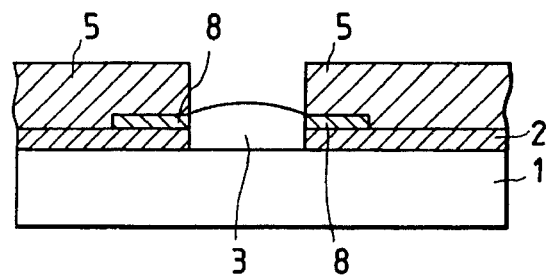
Figure 1F:
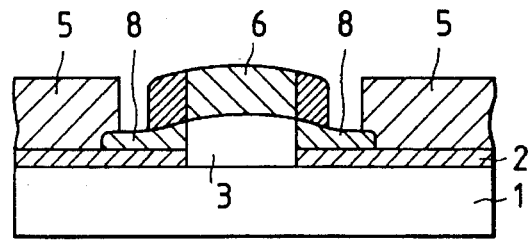
Figure 1G:
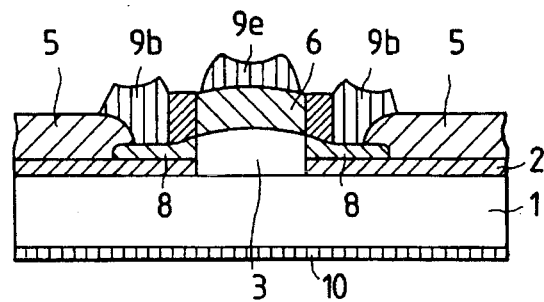
Figure 2:
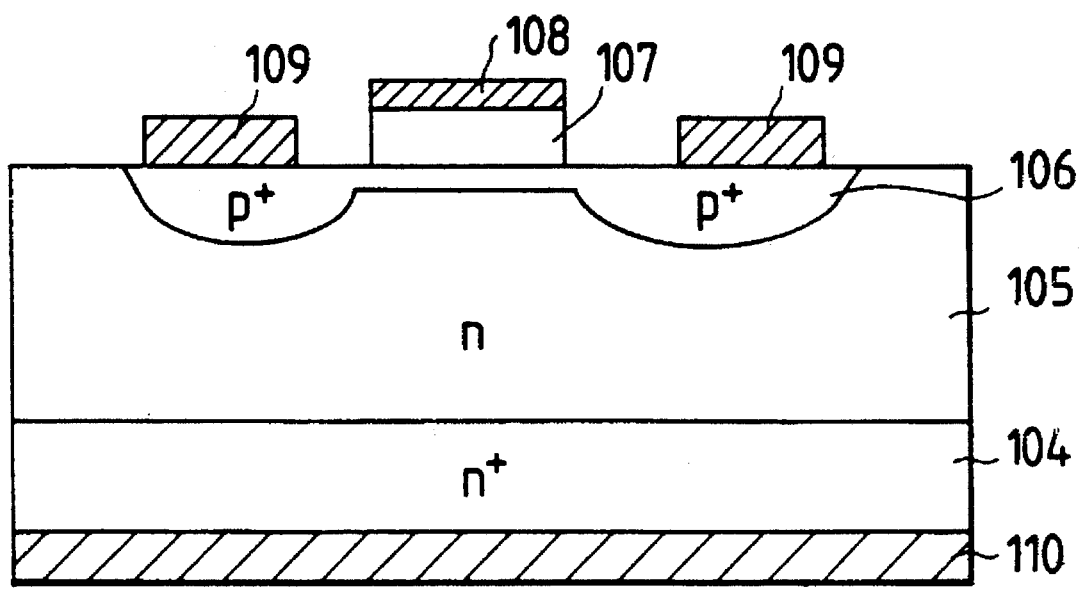
FIG. 2 is a diagram showing a conventional hetero junction bipolar transistor.

A method of manufacturing a hetero junction bipolar transistor according to this invention will be described with reference to FIG. 1.

First, as shown in the part (a) of FIG. 1, the upper surface of an N-type Si substrate 1 is thermally oxidized in an oxygen atmosphere at 900° C. for ten minutes, to form a layer of a kind of high melting point insulating material, namely an $SiO_2$ (silicon oxide) film 2. The $SiO_2$ layer thus formed is patterned as required by etching it with HF (hydrogen fluoride), as shown in the part (b) of FIG. 1.

Next, an Si (silicon) layer 3 is epitaxial-grown laterally of the substrate 1 by vapor growth deposition so that it is formed over the $SiO_2$ film 2. In the vapor growth deposition, the substrate temperature is 1000° C., the reaction gas is $SiH_4$ (monosilane), the carrier gas is $H_2$ (hydrogen), and the P-type impurity gas is $B_2H_6$, for instance. The Si layer 3 thus formed is of epitaxial P-type Si, and, as shown in the part (c) of FIG. 3, it is grown substantially in parallel with the substrate 1; that is, it is grown laterally to cover the upper surface of the $SiO_2$.

Thereafter, a resist layer 4 is formed by coating, and is patterned as required. Under this condition, as shown in the part (d) of FIG. 1, ion implantation is carried out using a P-type element such as B (boron), so that an external base region 8 of high density is formed in the epitaxial P-type Si layer 3 on the $SiO_2$ film 2. In the ion implantation for formation of-the external base region 8 high in boron density, the boron ($B^+$) energy is 30 keV, the dose is $1 \times 10^{15} cm^{-2}$.

Under this condition, the resist layer 4 is removed, and as shown in the part (e) of FIG. 1, an $SiO_2$ layer 5 is formed on the whole upper surface by vapor growth deposition, and then, for formation of an emitter region 6, the part of the $SiO_2$ 5 which is located over the Si layer 3 is etched with HF (hydrogen fluoride) to form an opening there.

As shown in the part (f) of FIG. 1, an N-type β-SiC (beta-silicon carbide) layer 6 is grown, by vapor growth deposition, on the part of the Si layer 3 which is exposed through the opening. Thereafter, the polycrystal SiC film formed on the $SiO_2$ layer is removed by etching it with HF.

Thereafter, the contact portions of the external base region 8 and electrodes are removed by using HF (hydrogen fluoride), and Al layers 9 are vacuum evaporated thereon, to form an emitter electrode $9_e$ and a base electrode $9_b$.

Finally, an AuSb layer is vacuum-deposited on the rear surface of the substrate 1, to form a collector electrode 10.

Thus, a hetero junction bipolar transistor has been formed as shown in the part (g) of FIG. 1. In the hetero junction bipolar transistor thus formed, the base region is provided by forming the Si layer laterally by epitaxial growth, and the base region thus provided isolates the collector region and the external base region from each other.

As was described above, the method of manufacturing a hetero junction bipolar transistor according to the invention comprises: the step of patterning the high melting point material layer on the Si substrate; the step of growing the Si layer laterally by vapor growth deposition; and the step of growing the semiconductor layer on the Si layer thus grown, which is larger in band gap than the Si layer. In the hetero junction bipolar transistor formed according to the method of the invention, the base region is provided by forming the Si layer laterally by epitaxial growth, and the base region thus provided isolates the collector region and the external base region from each other; that is, the collector region and the external base region are isolated from each other by the high melting point insulating material layer. Hence, no current flows from the collector region to the external base region; that is, the HBT (hetero junction bipolar transistor) of the invention is high in gain. In addition, since the base resistance can be decreased, the HBT can operate at higher speed.

In this embodiment, $SiO_2$ is used as an insulating material having a high melting point, but $Si_3N_4$ can be used instead.

As is apparent from the above description, the hetero junction bipolar transistor according to the invention is improved in operating speed, as aimed in developing the invention.

What is claimed is:

1. A hetero junction bipolar transistor comprising a silicon substrate having first and second sides and forming a collector region at the first side, an insulating layer having first and second sides, the first side being formed on the second side of the substrate and having an opening exposing the substrate, an epitaxial layer formed on the substrate in the opening in the insulating layer and extending on the second side of the insulating layer, an emitter region formed on the epitaxial layer over the opening in the insulating layer, the epitaxial layer containing an external base region formed on the second side of the insulating layer so that the collector region in the substrate and the external base region are separated from each other by the insulating layer, thereby reducing the flow of current from the collector region to the base region, an emitter electrode on the emitter region and a collector electrode on a portion of the collector region which is on the first side of the substrate.

* * * * *